(12) United States Patent
Lee et al.

(10) Patent No.: US 6,858,543 B2
(45) Date of Patent: Feb. 22, 2005

(54) METHOD OF FORMING TUNNEL OXIDE FILM IN SEMICONDUCTOR DEVICE

(75) Inventors: Seung Cheol Lee, Ichon-Shi (KR); Sang Wook Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/730,688

(22) Filed: Dec. 8, 2003

(65) Prior Publication Data

US 2004/0266110 A1 Dec. 30, 2004

(30) Foreign Application Priority Data

Jun. 27, 2003 (KR) .................................. 10-2003-42430

(51) Int. Cl.⁷ ...................... H01L 21/336; H01L 21/302
(52) U.S. Cl. ...................... 438/706; 438/714; 438/424; 438/735
(58) Field of Search ................................. 438/424–434, 438/706–737, 773–798

(56) References Cited

U.S. PATENT DOCUMENTS

| | | | | | |
|---|---|---|---|---|---|
| 5,538,923 | A | * | 7/1996 | Gardner et al. | 438/264 |
| 6,146,948 | A | * | 11/2000 | Wu et al. | 438/275 |
| 6,147,008 | A | * | 11/2000 | Chwa et al. | 438/762 |
| 6,573,141 | B1 | * | 6/2003 | Kickel et al. | 438/264 |

* cited by examiner

Primary Examiner—Michael Lebentritt
(74) Attorney, Agent, or Firm—Marshall, Gerstein & Borun LLP

(57) ABSTRACT

The present invention relates to a method of forming a tunnel oxide film in a semiconductor device, in which a predetermined thickness of the oxide film is not removed during a process of removing the oxide film in a memory cell area and a low voltage transistor area after a gate oxide film for a high voltage transistor is formed, thereby preventing increase of surface roughness on a substrate and contamination caused by absorbed carbon components which are generated when the oxide film and the photo resist film are removed. Therefore, it is possible to form a tunnel oxide film having an excellent film quality.

5 Claims, 4 Drawing Sheets

METHOD OF FORMING TUNNEL OXIDE FILM IN SEMICONDUCTOR DEVICE

BACKGROUND

1. Field of the Invention

The present invention relates to a method of forming a tunnel oxide film in a semiconductor device and, more particularly, to a method of forming a tunnel oxide film in a semiconductor device capable of preventing degradation of film quality caused by absorbed carbon components and a rough surface on a semiconductor substrate.

2. Discussion of Related Art

FIGS. 1A to 1D are cross-sectional views for explaining a conventional method of forming a tunnel oxide film in a semiconductor device.

Referring to FIG. 1A, in order to form a gate oxide film for a high voltage transistor, a first oxide film 2 having a thickness of 350 Å is formed on a semiconductor substrate 1 which has undergone predetermined processes.

Referring to FIG. 1B, a photo resist film 3 is formed on the first oxide film 2. Then, the photo resist film 3 is patterned to expose the first oxide film 2 formed on portions in which memory cells and low voltage transistors are to be formed.

Referring to FIG. 1C, the exposed portions on the first oxide film 2 are removed after the patterned photo resist film 3 is consolidated by a Descum process. In this case, the first oxide film 2 is removed by using a 300:1 BOE (Buffered Oxide Etchant) for a period of 2,280 seconds, and then the photo resist film 3 is removed by using $H_2SO_4$ solution. Subsequently, a cleaning process is performed by using an SC-1 solution.

Referring to FIG. 1D, a second oxide film 4 having a thickness of 80 Å is formed on a whole top surface. In this case, a thick gate oxide film including the first oxide film 2 and the second oxide film 4 is formed in a high voltage transistor area, whereas a tunnel oxide film including the second oxide film 4 is formed in a memory cell area and a low voltage transistor area.

According to the conventional method, during the removal of the first oxide film 2 in a memory cell area and a low voltage transistor area by using a BOE, an over-etching of 30% occurs so that surface roughness of the semiconductor substrate 1 is increased and carbon components included in the photo resist film are absorbed on the surface of the semiconductor substrate 1 when the photo resist film 3 is removed by using $H_2SO_4$ solution. The absorbed carbon components are seldom removed even by a subsequent cleaning process using an SC-1 solution or a preliminary cleaning process using a 50:1 HF solution before the tunnel oxide film is formed. As a result, the remaining carbon components bring about silicon dangling bonds. This makes film quality be degraded when a tunnel oxide film is formed under the state that the carbon components exist, whereby the resulted device may have a bad electrical property.

FIGS. 2 and 3 are graphs showing the results of a constant current stress test (CCST) for a flash memory device according to the conventional method. The results show that uniformity of distribution is bad and a proportion of defect is also high. Particularly, most of initial defects are distributed in the edge portion of a wafer.

SUMMARY OF THE INVENTION

Accordingly, the present invention is directed to provide a method of forming a tunnel oxide film in a semiconductor device in which a predetermined thickness of the oxide film is not removed during a process of removing the oxide film in a memory cell area and a low voltage transistor area after a gate oxide film for a high voltage transistor is formed, thereby preventing increase of surface toughness on a substrate and contamination caused by absorbed carbon components generated when the oxide films and the photo resist film are removed.

One aspect of the present invention is to provide a method of forming a tunnel oxide film in a semiconductor device, comprising the steps of: (a) forming a first oxide film on a semiconductor substrate, and then forming a photo resist pattern exposing the first oxide film in a memory cell area and a low voltage transistor area; (b) removing a predetermined thickness of the exposed first oxide film and the photo resist pattern sequentially; and (c) removing the remaining first oxide film completely and then forming a second oxide film on a whole surface.

In the aforementioned of a method of forming a tunnel oxide film in a semiconductor device according to another embodiment of the present invention, the first oxide film is a pure oxide film grown at a temperature of 750° C. to 850° C. to have a thickness of 350 Å to 600 Å.

In the aforementioned of a method of forming a tunnel oxide film in a semiconductor device according to another embodiment of the present invention, the step (b) further comprises steps of: removing a predetermined thickness of the first oxide film by using a 300:1 BOE for a period of 1,730 to 1,735 seconds; removing the photo resist pattern by using a $H_2SO_4$ solution; and performing a cleaning process using an SC-1 solution to remove pollutants such as organic components or particles.

In the aforementioned of a method of forming a tunnel oxide film in a semiconductor device according to another embodiment of the present invention, a thickness of the first oxide film remaining after the step (b) is in the range of 17 Å to 23 Å, and the first oxide film is preferably removed by a cleaning process using a 50:1 HF solution in the step (c).

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
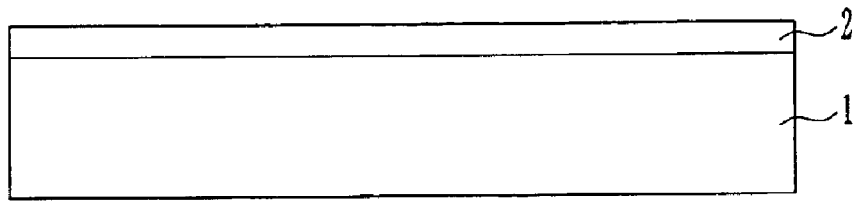
FIGS. 1A to 1D are cross-sectional views for explaining a conventional method of forming a tunnel oxide film in a semiconductor device.
Figure 1B:
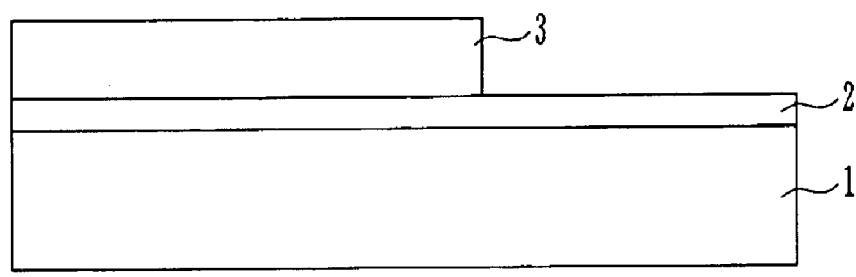
Figure 1C:
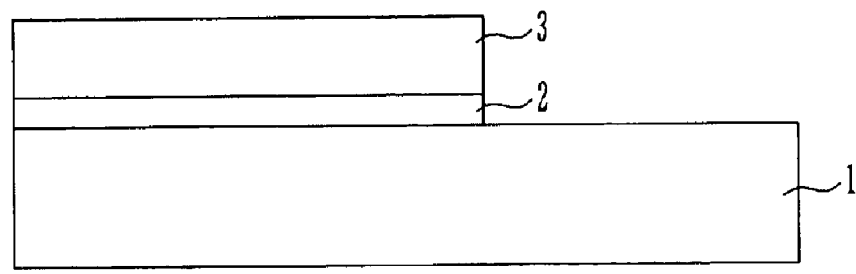
Figure 1D:
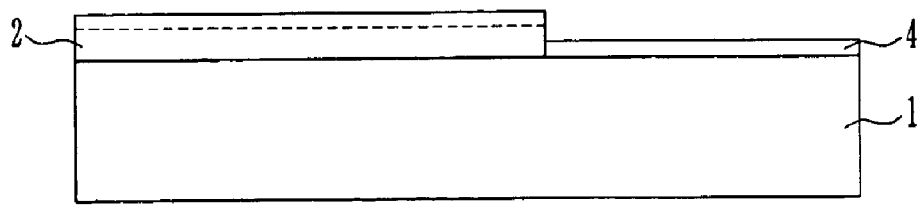
Figure 2:
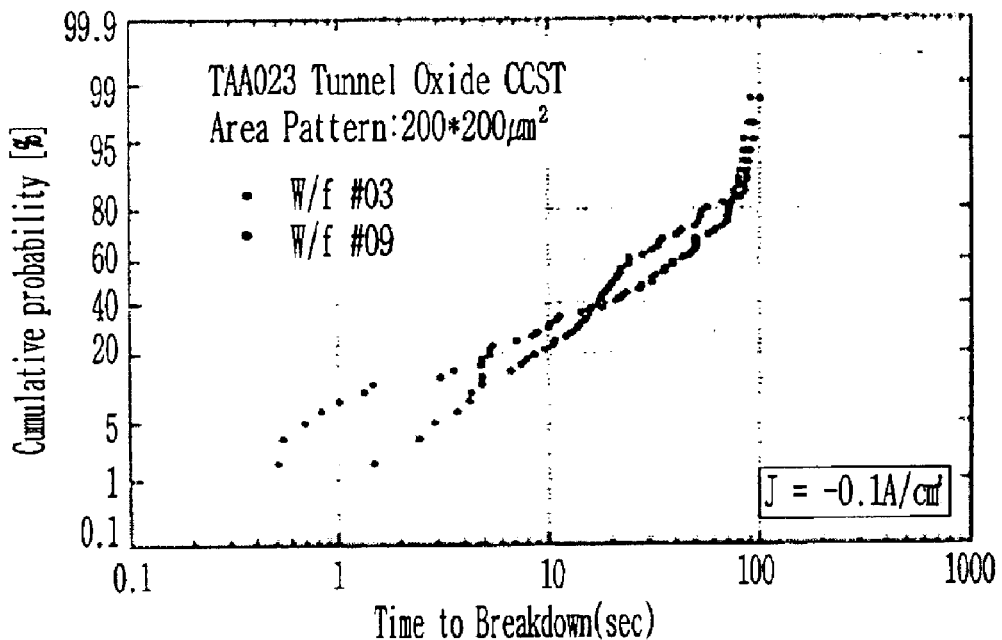
FIGS. 2 and 3 are graphs showing the results of a constant current stress test for a flash memory device according to a conventional method.
Figure 3:
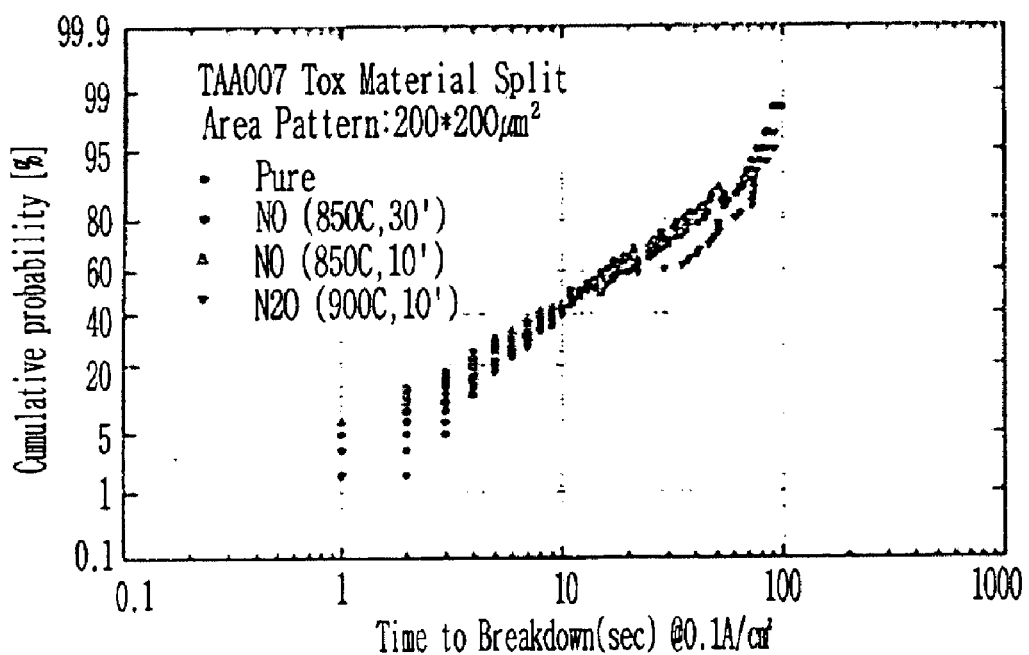

The present invention will be described in detail by way of the preferred embodiment with reference to the accompanying drawings, in which like reference numerals are used to identify the same or similar parts.

FIGS. 4A to 4D are cross-sectional views for explaining a method of forming a tunnel oxide film in a semiconductor device according to the present invention.

Figure 4A:
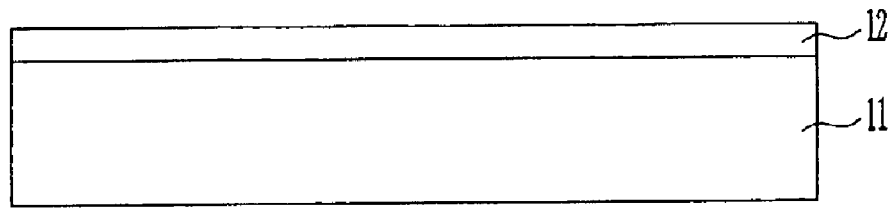
FIGS. 4A to 4D are cross-sectional views for explaining a method of forming a tunnel oxide film in a semiconductor device according to the present invention.

Referring to FIG. 4A, in order to form a gate oxide film for a high voltage transistor, a first oxide film 12 having a thickness of 350 Å to 600 Å is formed on a semiconductor substrate 11 which has undergone predetermined processes. The first oxide film 12 is made of a pure oxide grown at a temperature of 750° C. to 850° C.

Figure 4B:
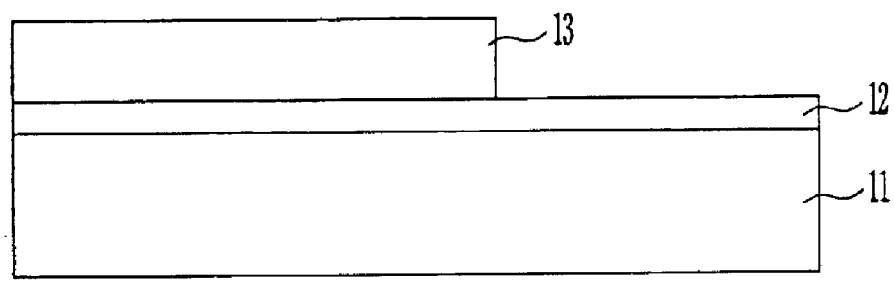

Referring to FIG. 4B, a photo resist pattern 13 is formed on the first oxide film 12 and then patterned to expose the first oxide film 12 in the areas that a memory cell and a low voltage transistor are to be formed.

Figure 4C:
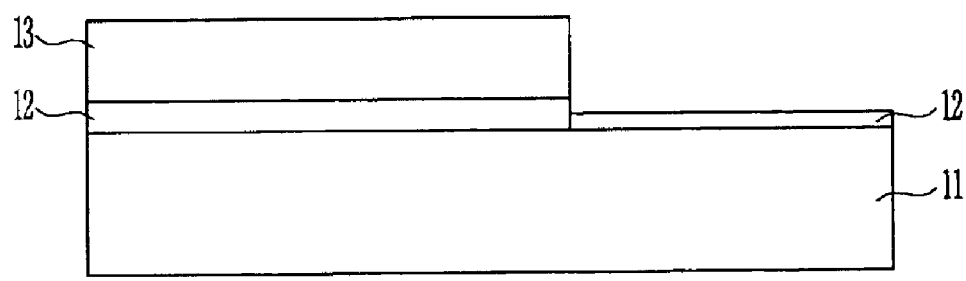

Referring to FIG. 4C, a Discum process is performed at a temperature of 80° C. to 140° C. for a period of 10 minutes or less to consolidate the patterned photo resist film 13. Then, a predetermined thickness of the first oxide film 12 in each exposed portion is removed. Subsequently, a part of the first oxide film 12 is removed by a 300:1 BOE for a period of 1,730 to 1,735 seconds, the photo resist film 13 is removed by a $H_2SO_4$ solution, and then a cleaning process is performed by an SC-1 solution so that pollutants such as organic components and particles are completely removed. In this case, the organic pollutants may be removed in such a way that a Caro's acid is formed by the reaction of $H_2SO_4/H_2O_2$ at a high temperature of 80° C. to 100° C., and then a dehydration and an oxidation are performed. The aforementioned processes including the process of removing the first oxide film 12, the process of removing the photo resist film 13, and the cleaning process are performed sequentially.

Figure 4D:
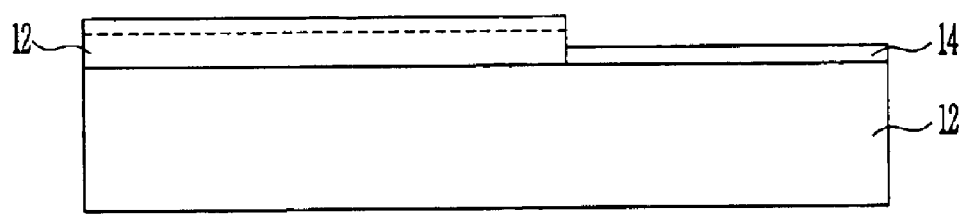

Referring to FIG. 4D, the remaining first oxide film 12 is completely removed by a pre-cleaning process FN40" using a 50:1 HF solution, and then the second oxide film 14 having a thickness of 80 Å is formed on a whole top surface. As a result, a thick gate oxide film including the first oxide film 12 and the second oxide film 14 is formed in a high voltage transistor area, and a tunnel oxide film including the second oxide film 14 is formed in a memory cell area and a low voltage transistor area.

The aforementioned second oxide film 14 is formed by an oxidation process using $H_2/O_2/N_2$ gas and a heat treatment using $N_2$ gas and has a thickness of 80 Å in a high voltage transistor area or 350 Å in a memory cell area and a low voltage transistor area. Meanwhile, a predetermined thickness of the first oxide film 12 in a high voltage transistor area may be removed during the aforementioned pre-cleaning process.

According to the present invention, as shown in FIG. 4C, a predetermined thickness, e.g., in the range of 17 Å to 23 Å, of the first oxide film 12 on the semiconductor substrate 11 is not removed during the process of removing the first oxide film 12 and the photo resist film 13. For this reason, it is possible to minimize increase of the surface roughness and damages on the semiconductor substrate 11 caused by the BOE and prevent contamination caused by the remaining carbon components included in the photo resist film 13. In addition, it is possible to improve carrier mobility and breakdown characteristic of the tunnel oxide film because the second oxide film 14 is formed immediately after the remaining first oxide film 12 is completely removed.

Figures 5, 6:
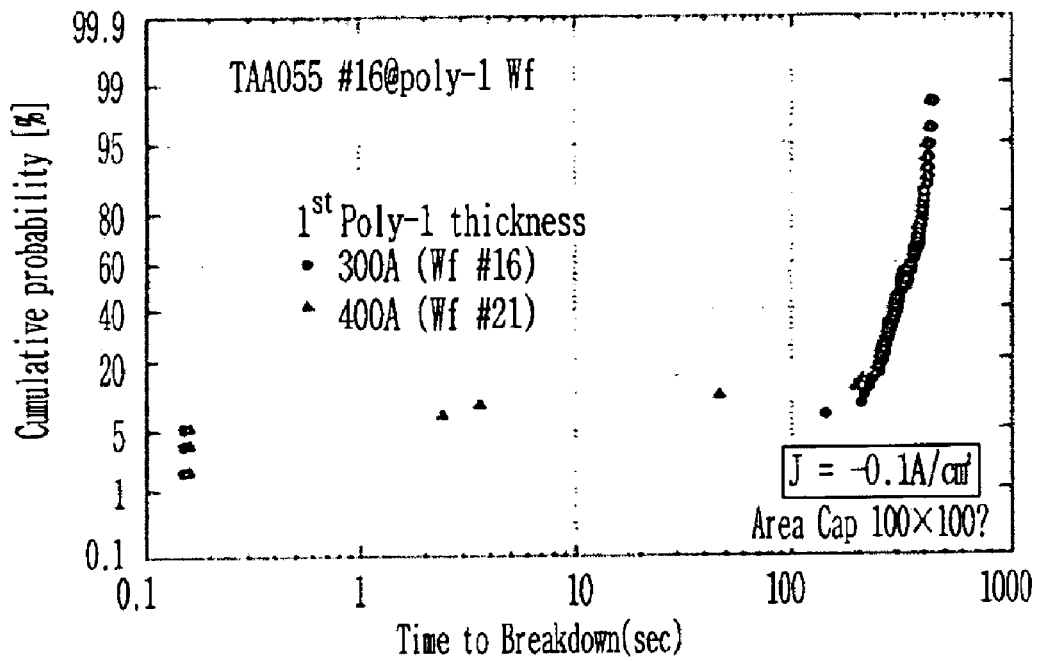
FIG. 5 is a graph showing the result of a constant current stress test for a flash memory device according to the present invention.
FIG. 6 is a plan view showing distribution of dies on a wafer together with the results of the constant current stress test.

FIG. 5 is a graph showing the result of a current stress test characteristic for a flash memory device according to the present invention, where it is possible to recognize that the uniformity of the current stress test characteristic is improved as a whole to show an excellent characteristic and a proportion of initial defect is also decreased. In addition, as shown in FIG. 6, it is possible to recognize that there are only three defective dies on the edge portion of a wafer.

As described above, according to the present invention, a predetermined thickness of the oxide film is not removed during a process of removing the oxide film in a memory cell area and a low voltage transistor area after a gate oxide film for a high voltage transistor is formed, thereby preventing increase of surface roughness on a substrate and contamination caused by absorbed carbon components which are generated when the oxide films and the photo resist film are removed. Therefore, it is possible to form a tunnel oxide film having an excellent film quality, thereby improving an electrical property of the resulted device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a tunnel oxide film in a semiconductor device, comprising the steps of:

(a) forming a first oxide film on a semiconductor substrate, and then forming a photo resist pattern exposing the first oxide film in a memory cell area and a low voltage transistor area;

(b) removing a predetermined thickness of the exposed first oxide film and the photo resist pattern sequentially; and (c) removing the remaining first oxide film completely and then forming a second oxide film on a whole surface.

2. The method of claim 1, wherein the first oxide film is a pure oxide film, and it is grown at a temperature in the range of 750° C. to 850° C. to have a thickness in the range of 350 Å to 600 Å.

3. The method of claim 1, wherein the step (b) further comprises the steps of:

removing a predetermined thickness of the first oxide film by using a 300:1 BOE for a period in the range of 1,730 seconds to 1,735 seconds;

removing the photo resist pattern by using a $H_2SO_4$ solution; and performing a cleaning process using an SC-1 solution to remove pollutants such as organic components or particles.

4. The method of claim 1, wherein a thickness of the first oxide film remaining after the step (b) is in the range of 17 Å to 23 Å.

5. The method of claim 1, wherein the first oxide film is removed by performing a cleaning process using a 50:1 HF solution in the step (c).

* * * * *